United States Patent
Mei et al.

[11] Patent Number: 6,107,641
[45] Date of Patent: *Aug. 22, 2000

[54] THIN FILM TRANSISTOR WITH REDUCED PARASITIC CAPACITANCE AND REDUCED FEED-THROUGH VOLTAGE

[75] Inventors: Ping Mei, Palo Alto; Rene A. Lujan, Sunnyvale; James B. Boyce, Los Altos; Christopher L. Chua; Michael G. Hack, both of Mountain View, all of Calif.

[73] Assignee: Xerox Corporation, Stamford, Conn.

[*] Notice: This patent issued on a continued prosecution application filed under 37 CFR 1.53(d), and is subject to the twenty year patent term provisions of 35 U.S.C. 154(a)(2).

[21] Appl. No.: 08/927,023
[22] Filed: Sep. 10, 1997
[51] Int. Cl.⁷ .................................................. H01L 29/76
[52] U.S. Cl. .......................... 257/66; 257/59; 257/70; 257/435
[58] Field of Search .................... 257/66, 70, 435, 257/436, 59

[56] References Cited

U.S. PATENT DOCUMENTS

| | | | |
|---|---|---|---|
| 3,760,242 | 9/1973 | Duffy et al. | 257/637 |
| 5,441,905 | 8/1995 | Wu | 438/160 |
| 5,583,369 | 12/1996 | Yamazaki et al. | 257/635 |
| 5,637,519 | 6/1997 | Tsai et al. | 438/160 |
| 5,696,011 | 12/1997 | Yamazaki et al. | 438/166 |
| 5,733,804 | 3/1998 | Hack et al. | 439/158 |
| 5,834,797 | 11/1998 | Yamanaka | 257/57 |

OTHER PUBLICATIONS

S. Kawai, T. Kodama, Y. Nasu. S. Yanagisawa, K. Asama;A Self–Alignment Processed a–Si:H TFT Matrix Circuit for LCD Panels; Proceedings of the SID, vol. 25/1, 1984; pp. 21–24.

Heinz H. Busta, Jay E. Pogemiller, Robert W. Standley, Kenneth D. Mackenzie; Self–Aligned Bottom–Gate Submicrometer–Channel–Length a–Si:H Thin–Film Transistors; IEEE Transaction on Electron Devices vol. 36 No. 12, Dec. 1989, pp. 2883–2887.

S. Nishida, H. Uchida, S. Kaneko; A New Self–Aligned A–Si TFT Using Ion Doping and Chromium Silicide Formation; Mat. Res. Soc. Symp. Proc. vol. 219, 1991; pp. 303–308.

P. Mei, G. B. Anderson, J. B. Boyce, D. K. Fork, R. Lujan; Laser Doping for Self–Aligned Amorphous Silicon Thin Film Transistors; Electrochemical Society Proceedings vol. 96–23; pp. 51–58 Oct. 1996.

O. Sugiura, C. D. Kim, Matsumura; A New Self Alignment Processes for Amorphous Silicon Thin Film Transistors with Polysilicon Source and Drain; Electronics Letters vol. 29 No. 9; Apr. 29th, 1993; pp. 750–752.

Chang–Dong Kim, Osamu Suiura, Masakiyo Matsumura; Amorphous–Silicon TFTs with Self–Aligned Poly–Silicon Source and Drain; Mat. Res. Soc. Symp. Proc. vol. 297, 1993, pp. 925–930.

(List continued on next page.)

Primary Examiner—David Hardy
Assistant Examiner—George C. Eckert, II

[57] ABSTRACT

An improved thin film transistor structure is provided having no source/gate or drain/gate overlap. A laser doping technique is applied to fabricate such transistors. Eliminating source/gate and drain/gate overlap significantly reduces or eliminates parasitic capacitance and feed-through voltage between source and gate. Short-channel a-Si:H thin film transistors may be obtained having high field effect mobilities. Improved pixel performance and pixel-to-pixel uniformity is provided.

19 Claims, 16 Drawing Sheets

OTHER PUBLICATIONS

J. B. Boyce, G. B. Anderson, P. G. Carey, D. K. Fork, R. I. Johnson, P. Mei, S. E. Ready, P. M. Smith; Laser Doping and Crystallization of Amorphous Silicon Thin Films; Mat. Res. Soc. Symp. Proc. vol. 358, 1995, pp. 908–914.

E. A. Al–Muaimy, J. M. Marshall; Excimer Laser Crystallization and Doping of Source and Drain Regions in High Quality Amorphous Silicon Thin Film Transistors; Appl. Phys. Lett 69 (25), Dec. 16, 1996; pp. 3857–3859.

M. Matsumura, C. D. Kim; A Short–Channel a–Si TFT Process; ECS Fall Meeting Abstracts vol. 96–2; Oct. 1996; p. 682.

A. Convertino, A. Valentini, T. Ligonzo, R. Cingolani; Organic–Inorganic Dielectric Multilayer Systems as High Reflectivity Distributed Bragg Reflectors; Appl. Phys. Lett. 71 (6); Aug. 11, 1997; pp. 732–734.

Kawachi et al., A Novel Technology for A–SI TFT–LCD'S with Buried ITO Electrode Structure, *IEEE Transactions on Electron Devices*, vol. 41, No. 7, Jul. 1994, pp. 1120–1124.

Kim et al., Excimer–Laser Crystallized Poly–SI TFT'S with Transparent Gate, *IEEE Transactions on Electron Devices*, vol. 43, No. 4, Apr. 1996, pp. 576–579.

Sameshima et al., Analysis of Dopant Diffusion in Molten Silicon Induced by a Pulsed Excimer Laser, *Japanese Journal of Applied Physics*, vol. 26, No. 7, Jul. 1987, pp. L1208–L1210.

Wolf et al., Silicon Processing for the VLSI Era vol. 1—Process Technology, *Published by Lattice Press*, 1986, pp. 136–137 and 418–423.

FIG. 10A
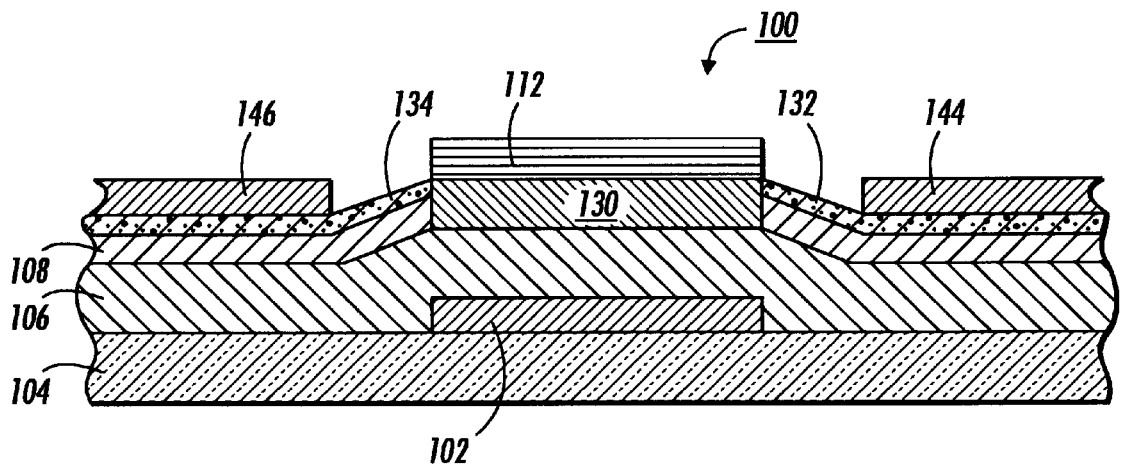
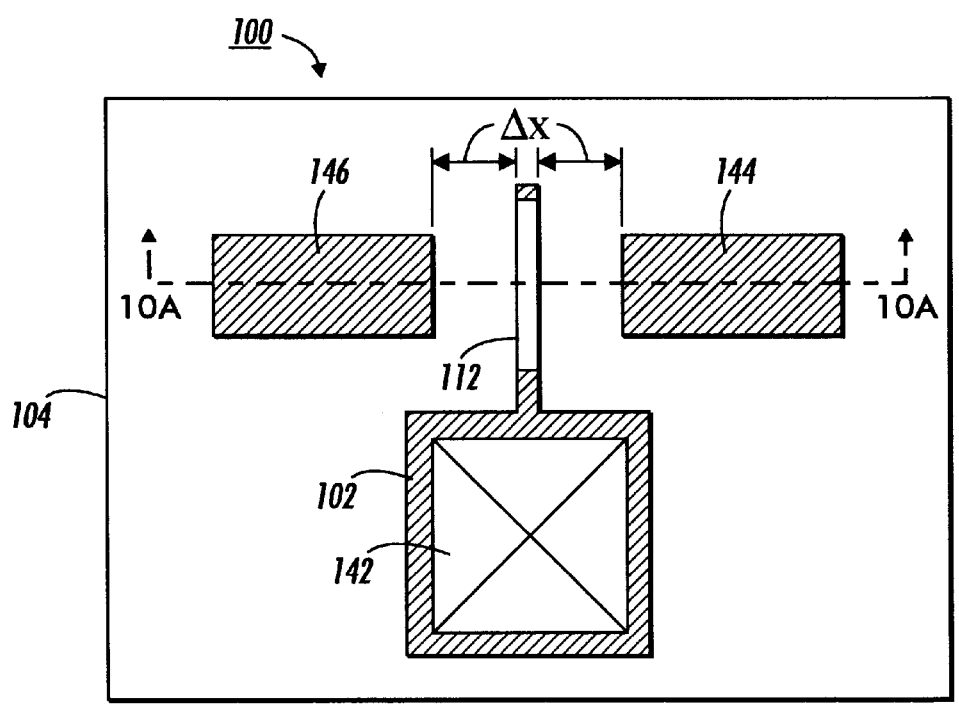
FIG. 10B

FIG. 12
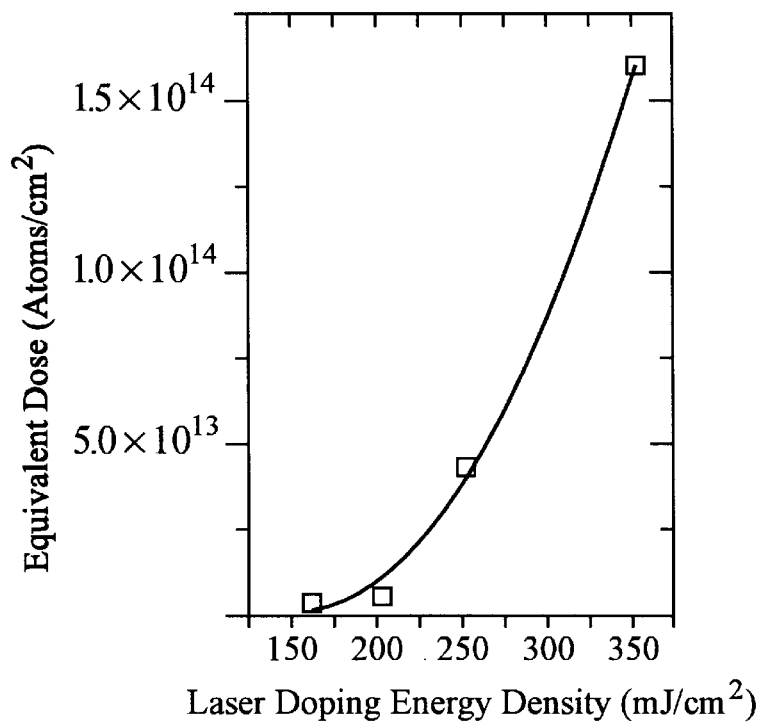
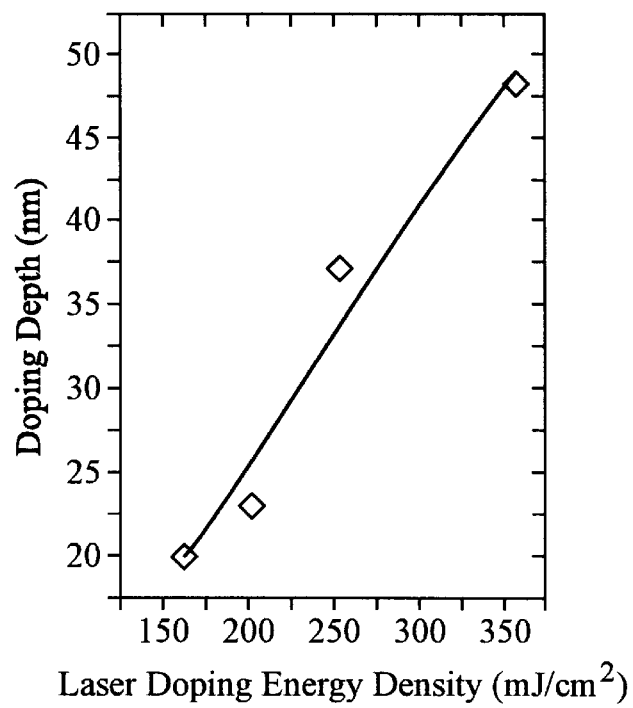
FIG. 13

FIG. 14
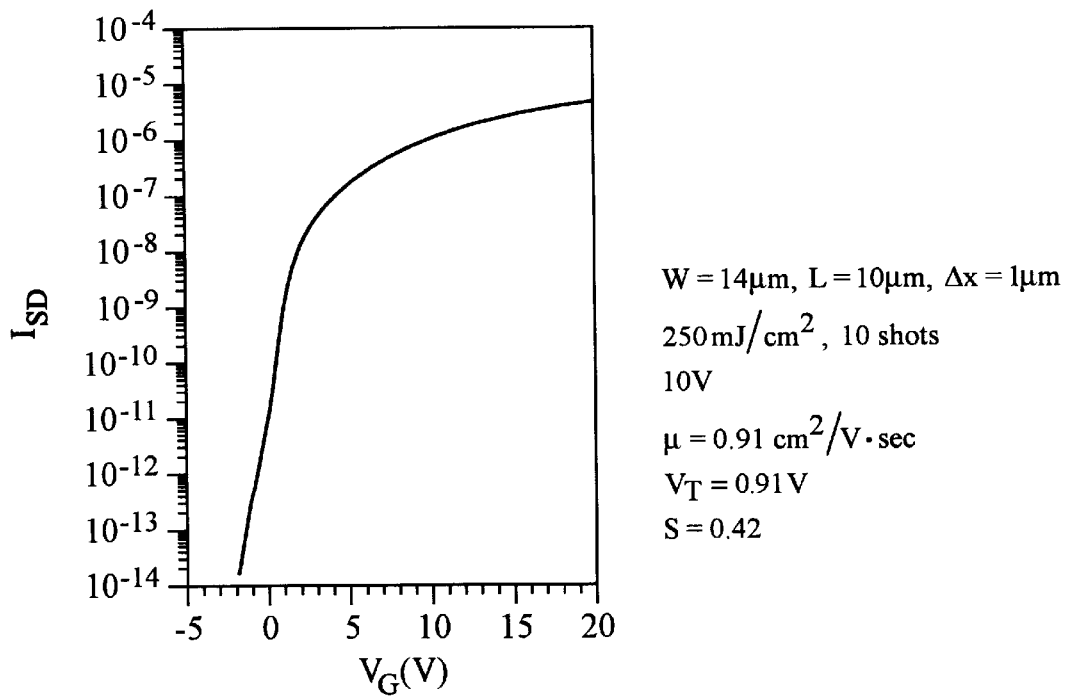
W = 14μm, L = 10μm, Δx = 1μm
250 mJ/cm$^2$, 10 shots
10V
μ = 0.91 cm$^2$/V·sec
V$_T$ = 0.91 V
S = 0.42
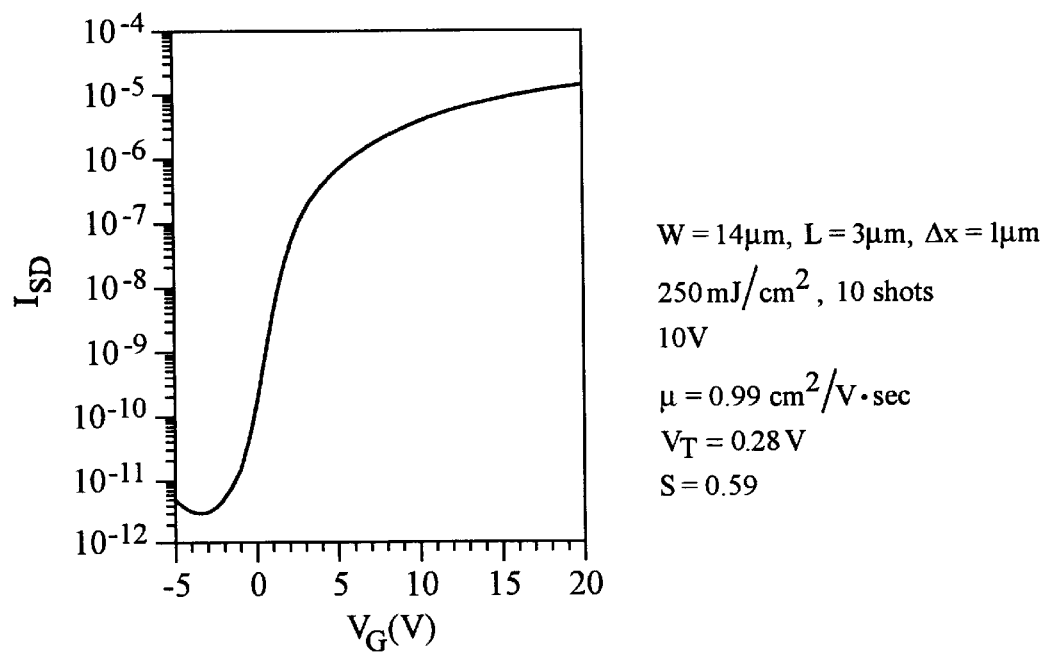
W = 14μm, L = 3μm, Δx = 1μm
250 mJ/cm$^2$, 10 shots
10V
μ = 0.99 cm$^2$/V·sec
V$_T$ = 0.28 V
S = 0.59
FIG. 15

FIG. 18
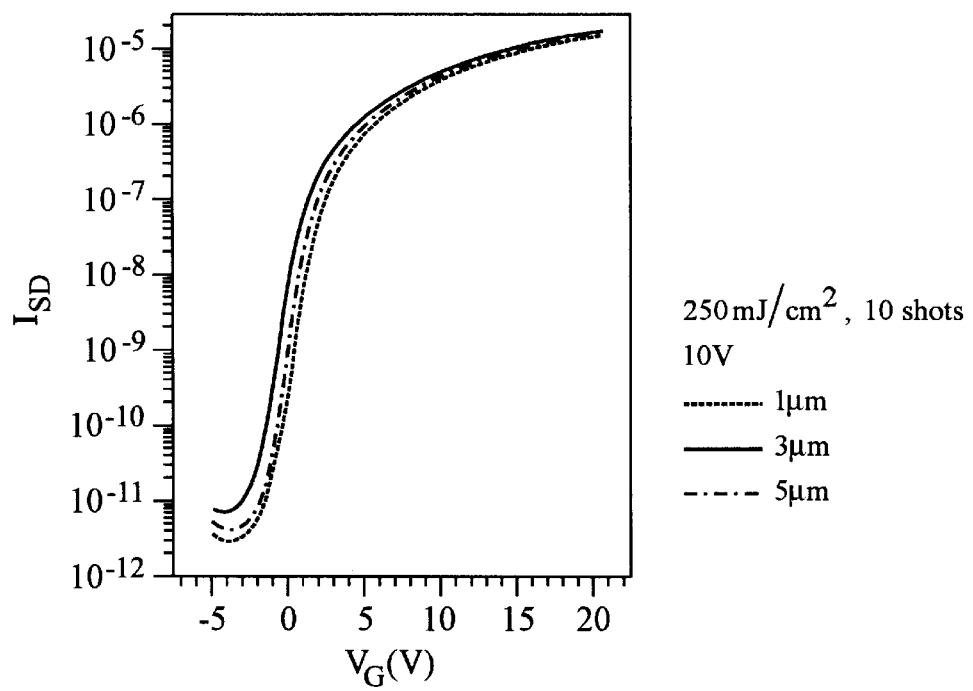
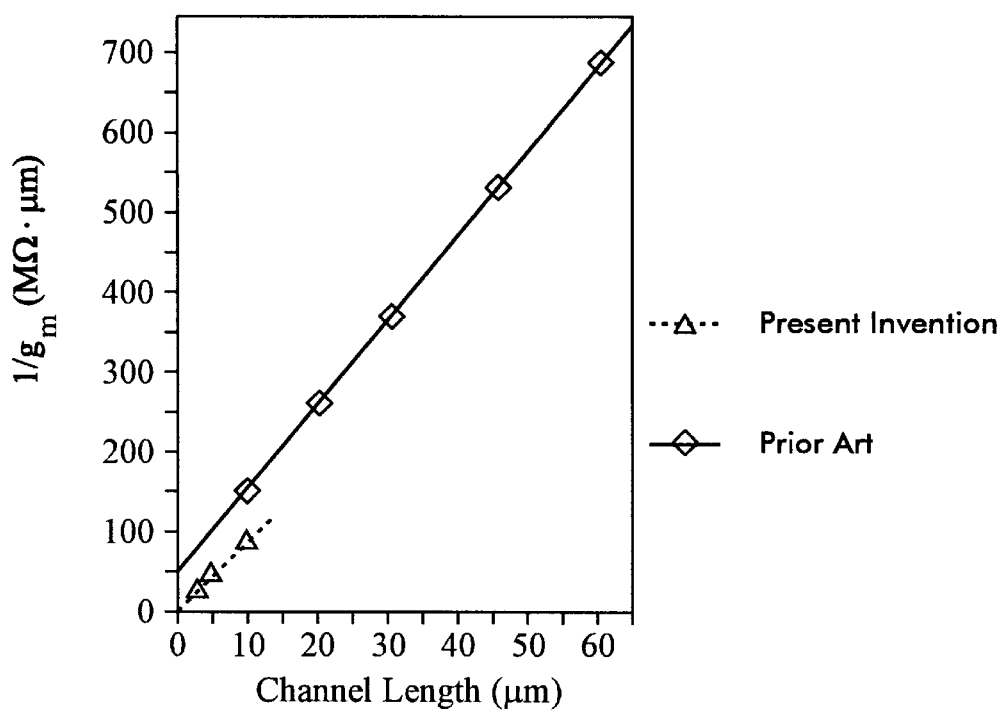
FIG. 19

THIN FILM TRANSISTOR WITH REDUCED PARASITIC CAPACITANCE AND REDUCED FEED-THROUGH VOLTAGE

CROSS REFERENCE TO RELATED APPLICATIONS

The present invention relates to the subject matter of copending U.S. patent application Ser. Nos. 08/655,549, and 08/927,025, each of which is incorporated herein by reference.

BACKGROUND

The present invention relates to thin film structures and processes for making same. More particularly, the present invention relates to a thin film transistor wherein each of the source and drain electrodes are formed so as not to overlap any portion of the transistor's channel, thereby reducing or eliminating parasitic capacitance and feed-through voltage.

In a typical bottom-gate transistor structure, a metal gate material is formed on a substrate. The substrate is transparent to ultraviolet (UV) light, while the gate metal is opaque to such light. A dielectric layer is formed over the gate metal, and a layer of active material in which a channel will be formed is deposited over the dielectric layer. The layer of active material may, for example, be intrinsic hydrogenated amorphous silicon (a-Si:H), or other similar material. A nitride passivation layer from which an island is subsequently formed is deposited over the layer of active material. Each of these additional layers is generally also transparent to the UV light. A layer of photoresist is next deposited over the passivation layer. UV light is then directed through the substrate, dielectric layer, active material layer, and passivation layer, where it ultimately exposes the photoresist, except where the UV light is blocked by the gate metal. The photoresist is next developed where it has been exposed to the UV light. The patterned photoresist is used as a mask to etch the nitride passivation layer, in all areas except where exposure of the photoresist was blocked by the gate metal (with the exception of some lateral etching). A nitride passivation island is thereby formed, defined by the gate electrode. Hence, this part of the structure is referred to as "self-aligned".

A contact layer, for example a-Si:H doped to be n+, is then deposited over the various layers. Lithography, or a similar process, is then employed to remove a section of the contact layer lying roughly over the gate metal. Since it is difficult to selectively etch doped a-Si:H over the intrinsic a-Si:H (i.e., remove the former but not the latter), the top passivation island is utilized as the etch-stop to form the source and drain electrodes. The final structure is shown in FIGS. 1(a) and 1(b), in which a thin film transistor (TFT) 10 consists of a substrate 12, gate metal 14 formed on substrate 12, gate dielectric layer 16, active layer 18, top passivation island 20, drain electrode 22 and source electrode 24. However, due to the aforementioned difficulty of selectively controlling the etching between doped a-Si:H and intrinsic a-Si:H, the doped a-Si:H is only doped so far, leaving a certain amount of the doped a-Si:H to overlap passivation island 20, as shown by regions 28 and 30. Hence, this part of the structure is not self-aligned.

While leaving overlaps 28 and 30 alleviates the problem of etching through the doped a-Si:H into the intrinsic a-Si:H, there are several reasons to remove as much of the contact layer overlaying the gate metal as possible. First, the larger the gap 26 between source and drain electrodes, the better the electrical isolation between them. Second, the length L of the channel of the transistor is preset by the transistors performance characteristics, materials, and other parameters. The overlaps 28 and 30 cause the channel to be longer than otherwise necessary, which in turn limits the reduction in size of the overall structure. For example, such length may be 5 or more micrometers ($\mu$m) for each of the channel 26, source overlap 28, and drain overlap 30, for a total of 15 or more $\mu$m. Very competitive active matrix thin film sensor cells today may be on the order of 50 $\mu$m across or smaller including photosensor, electrical connections, etc. Thus, reducing overlap shrinks the length of the transistor, making more room for detector material in the cell and/or more cells in an array of a given size.

Finally, and perhaps most importantly, parasitic capacitance is established between the source/drain electrode material and the gate material where they overlap one another. Parasitic capacitance is illustrated in the schematic diagram of FIG. 2, which is a cell 50 for either display or sensing. Cell 50 is provided with TFT 52, which acts as a switch for addressing the cell. The gate 54 of TFT 52 is connected to gate line 60, and the drain 56 of TFT 52 is connected to data line 62. The source 58 of TFT 52 is connected to either a sensor device (such as a p-i-n photodetector, not shown) or a display device (such as a liquid crystal layer structure, not shown), each generally referred to herein as pixel 66.

The overlaps 28 and 30 shown in FIG. 1(a) effectively results in parasitic capacitance between the source and gate, illustrated by capacitor 64. This parasitic capacitance results in feed-through voltage on the pixel electrode, causing image flicker (inaccuracy in the OFF-to-ON transition) and sticking (inaccuracy in the ON-to-OFF transition) in the case of a display device. In the case of a sensor device, parasitic capacitance results in readout noise. Also, since the overlap may vary from cell to cell across the array (for example, due to variations in the substrate, resolution of the lithography, etc.) the feed-through voltage may similarly vary from cell to cell.

FIG. 3 illustrates a number of the disadvantageous consequences of parasitic capacitance and feed-through voltage. Shown in FIG. 3 is the voltage $V_g$ on gate 54 and the voltage $V_d$ on drain 56 of TFT 52 at times $t_1$ through $t_5$. Also shown in FIG. 3 is the actual voltage $V_{pix}$ at pixel 66, shown as a solid line, and the ideal voltage $V_{ideal}$ at pixel 66, shown as a dashed line. At time $t_1$, the voltage on data line 62 is high (typically 5–10 volts). However, the voltage on gate line 60 is low (typically 0 volts). Consequently, the channel of TFT 52 is closed, voltage is not permitted to flow between data line 62 and pixel 66, and for example in the case of a typical back lit liquid crystal display device, the pixel is opaque, or OFF.

At time $t_2$, the voltage on data line 62 remains high, but the voltage on gate line 60 goes from low to high (typically 10–15 volts). The channel of TFT 52 is consequently opened. This results in application of the voltage from data line 62 to pixel 66, causing pixel 66 to become transparent, or ON in the case of a back lit display. Pixel 66 typically has a certain degree of inherent capacitance, shown as $C_{pix}$. Also, due to the architecture of an integrated TFT and pixel structure, there typically is an overlap between the source electrode of the TFT 52 and an electrode of the pixel. This results in a capacitance $C_s$ between the source and pixel, which is in parallel with $C_{pix}$. However, as previously mentioned, there is also a capacitance between source 58 and gate 54 due to overlap 30 (FIG. 1(a)). Gate 54 is connected to gate line 60, while source 58 is connected to an electrode of pixel 66. This is represented by the capacitance $C_{gs}$, shown in FIG. 2, between gate line 60 and pixel 66. Thus, between time $t_2$ and time $t_3$, voltage at pixel 66 is as intended.

At time $t_3$, the voltage on gate line 60 is switched to low. Charge in the channel of TFT 52 is thereby depleted. However, at this time there is a difference in potential across $C_{gs}$, which causes part of the charge stored in $C_{pix}$ to be redistributed to $C_{gs}$, resulting in a voltage drop, $\Delta V_p$, referred to as feed-through voltage. At time $t_4$, voltage on the data line 62 is low, and the voltage on gate line 60 is switched from low to high. This once again opens the channel of TFT 52. However, since the voltage on data line 62 is low, the capacitances $C_{pix}$, $C_s$, and $C_{gs}$ are discharged to the line level of data line 62, switching pixel 66 OFF. At time $t_5$, voltages on both the gate line 60 and the data line 62 are low. However, again there is a difference in potential across $C_{gs}$, which causes charge redistribution from $C_{gs}$ to pixel 66, resulting in another feed-through voltage drop of $\Delta V_p$.

Ideally, the OFF state and ON state voltages are constant, as shown by the dotted line $V_{ideal}$. However, the parasitic capacitance contributed by the source electrode overlapping the gate electrode precludes obtaining this ideal response. Rather, at time $t_3$, when the gate voltage changes from high to low, there is a voltage drop from the value set by data line 62. In the case of a display apparatus, the feed-through voltage results in the aforementioned image "flicker" (brightness variation in OFF-to-ON state). Likewise, at time $t_5$, the feed-through voltage precludes a clean discharging of $C_{pix}$ and $C_s$, resulting in the aforementioned image "sticking" (remaining voltage, and hence transmission of light through the display pixel, from ON-to-OFF state).

Analogously, in the application of cell 50 to sensor applications, the various capacitance and feed-through voltage issues discussed above result in sensor noise. That is, feed-through voltage from gate line 60 through $C_{gs}$ adds to the voltage being read from the pixel 66, introducing signal error.

The extent of the feed-through voltage is a function of the level of the data line voltage, as expressed by $$\Delta V_p f(C_{pix}, C_{gs}) \cdot V_d$$

Thus, as $V_d$ varies, for example in greyscale applications, the feed-through voltage varies, which in turn varies the pixel response from what is expected at $V_d$. This means that grey level control is not uniform, for both display and sensing applications.

Several approaches have been pursued in the art to attempt to address the problems of parasitic capacitance and feed-through voltage. In one approach, ion implantation was used to form the source and drain electrodes in the same layer as the channel. The ions were introduced from the upper surface, using the passivation island as a mask. The ion implantation, however, results in structural damage at the locations of implantation. Annealing was used to eliminate this damage. Laser annealing, as opposed to thermal annealing, was used to reduce hydrogen out-diffusion, which would otherwise destroy the channel conductivity. The laser beam was introduced into the structure from the substrate side, and the gate electrode used as a mask to form the source and drain electrodes. However, the laser beam introduced from the substrate side of the structure is not able to anneal the material closest to the channel, since it is shadowed by the edge of the gate electrode. Thus damaged material remains between the source and channel and the gate and channel.

In another approach, a structure is formed as previously described. A layer of chromium is then deposited over the a-Si:H source/drain electrode layer. It is postulated that this results in the formation of chromium silicide. This material may then be selectively etched without damaging the underlying intrinsic a-Si:H channel layer. Etching continues to below the top surface of the passivation island. However, there are two problems with this approach. First, an overlap between source/drain and gate results, similar to that described immediately above, caused by the differences in width of the gate electrode and passivation island. This overlap precludes complete elimination of the problem of parasitic capacitance. Second, the contact resistance of the chromium suicide is very high. This is true despite efforts to dope the layer for improved conductivity.

In yet another approach, selective etching is proposed by employing negative photoresist (in which the exposed material is caused to be resistant to etching). A structure is fabricated as previously described. Active photoresist is deposited over the a-Si:H source/drain electrode layer. The structure is exposed from below, using the gate electrode as a mask. The structure is etched, removing the unexposed portion overlying the gate electrode. Provided the structure may be etched for a sufficient time (dictating the source/drain electrode layer thickness), lateral etching may be employed to remove the material which would otherwise form an overlap with the gate electrode. However, this approach appears to require a channel thickness above the optimal thickness for the TFT in order to avoid over etching into the channel layer.

Accordingly, there is a need in the art for an improved thin film transistor structure, and process for making same, which eliminates overlap between source and drain electrodes on the one hand and the gate electrode on the other. In an array of such structures, in which the TFTs switch pixels, such a structure would provide significantly improved device performance by eliminating parasitic capacitance and feed-through voltage between the source electrode and pixel. Cell to cell variation in device geometry and performance may also be significantly reduced. Device geometries may also be scaled down.

SUMMARY

According to the present invention, an improved thin film transistor is provided, having no overlap between the electrodes. Parasitic capacitance and feed-through voltage between the source electrode and the gate electrode are greatly reduced or eliminated in this structure.

Features provided by the present invention include: the reduction of image flicker and sticking for display, reduced readout noise for imaging application, and enhanced gray-level performance for both display and imaging application. The invention also allows for scaling down the dimension of the TFT pixel switches.

The present invention utilizes a laser doping technique to form self-aligned TFT source/drain regions. A doping mask is formed by an optical filter which is reflective to the laser doping wavelength (e.g., approx. 308 nm) and transparent to the lithography wave length (e.g., approx. 400 nm). The self-aligned doping mask also serves as the channel passivation island. The entire fabrication process is compatible with current large-area fabrication processes.

In one embodiment, the gate electrode is used as a mask to form the passivation island by back-side lithography. Front-side laser doping is then employed to dope regions immediately adjacent a channel in a TFT, addressing the problem of edge shadowing when forming the source and drain regions using the gate electrode as a mask.

Sidewall leakage current due to remnant impurities may also be reduced by patterning an uppermost passivation layer to act as an etchant mask, then etching the sidewalls of the active layer to remove impurities. The uppermost passivation layer is appropriately sized to allow registration with the tolerance of current mask alignment techniques.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

FIG. 10(a) and FIG. 10(b) are cross-section and plan views, respectively, of a TFT according to the present invention at a stage of its manufacture prior to completion.

FIG. 12 is a plot showing the results of an experiment measuring doping efficiency against the laser doping energy density for a laser doping process according to the present invention.

FIG. 13 is a plot of doping depth as a function of the laser doping energy density for a laser doping process according to the present invention.

FIG. 14 shows the transfer characteristics for a self-aligned TFT, as taught by the present invention, having a channel length of approximately 10 $\mu$m.

FIG. 15 shows the transfer characteristics of a self-aligned TFT, as taught by the present invention, having a channel length of approximately 3 $\mu$m.

FIG. 18 is a plot of gate voltage versus source/drain current for TFTs having a gap, $\Delta x$, between source/drain electrodes and optical filter island of 1, 3, and 5 $\mu$m.

FIG. 19 shows a comparison of the contact resistance of the electrodes as taught by the present invention and as conventionally known.

DETAILED DESCRIPTION

Figure 4A:
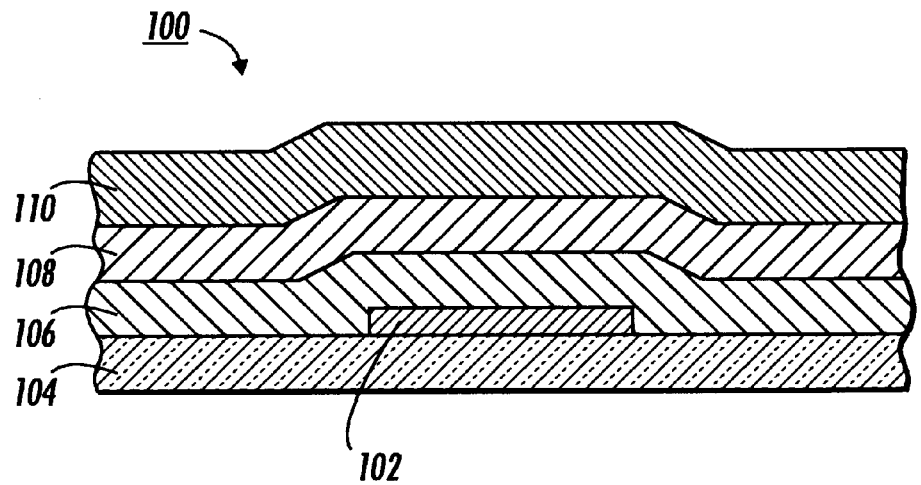
FIG. 4(a) and FIG. 4(b) are cross-section and plan views, respectively, of a TFT according to the present invention at an initial stage in the process of its manufacture.

With reference to FIGS. 4(a) and (b), the steps of a fabrication process according to one embodiment of the present invention will now be provided, along with a description of the resulting TFT structure 100. Initially, a number of the fabrication steps for the TFT according to the present invention are the same as those of a conventional process. Specifically, a metal gate layer for example Cr, TiW, MoCr, etc., 400–1000 Å, for a channel length of 3–15 $\mu$m is formed on a transparent substrate 104, such as glass (e.g., Corning 1737, from Corning Glass, Japan), quartz, etc. by sputter deposition, and standard lithographic techniques and wet etching. The metal gate layer is patterned by processes well known in the art to form metal gate electrode 102.

Figure 4B:
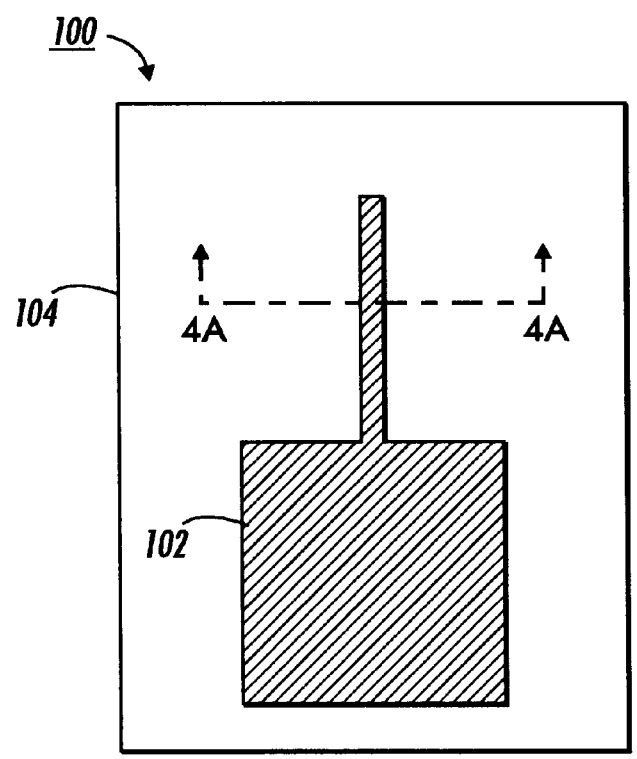

Over gate electrode 102, a gate dielectric layer 106 of silicon nitride is formed by plasma enhanced chemical deposition at 350° C. to a thickness of around 3000 Å. Onto gate dielectric layer 106, an intrinsic a-Si:H layer 108 of about 500 Å is deposited at about 275° C., which will form the channel of the TFT. An optical filter layer 110 is next deposited onto intrinsic a-Si:H layer 108. Optical filter layer 110 is a stack of sublayers with precisely controlled thicknesses and compositions. The role and specific details of optical filter layer 110 will be further discussed below. Plasma Enhanced Chemical Vapor Deposition (PECVD) is employed for deposition of each of these layers. At this point in the process, the structure thus produced is shown in cross section in FIG. 4(a) and in plan view in FIG. 4(b) (layers 106, 108, and 110 being transparent).

Figure 5A:
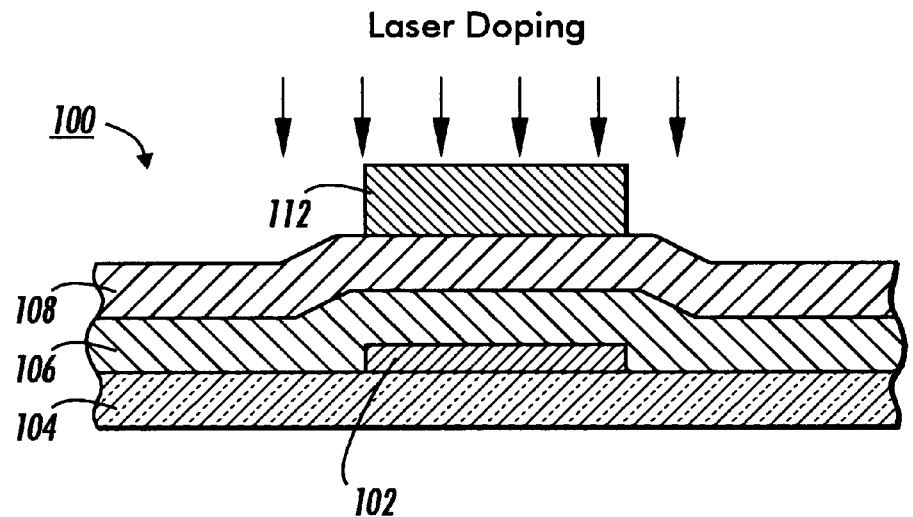
FIG. 5(a) and FIG. 5(b) are cross-section and plan views, respectively, of a TFT according to the present invention at an intermediate stage in the process of its manufacture.
Figure 5B:
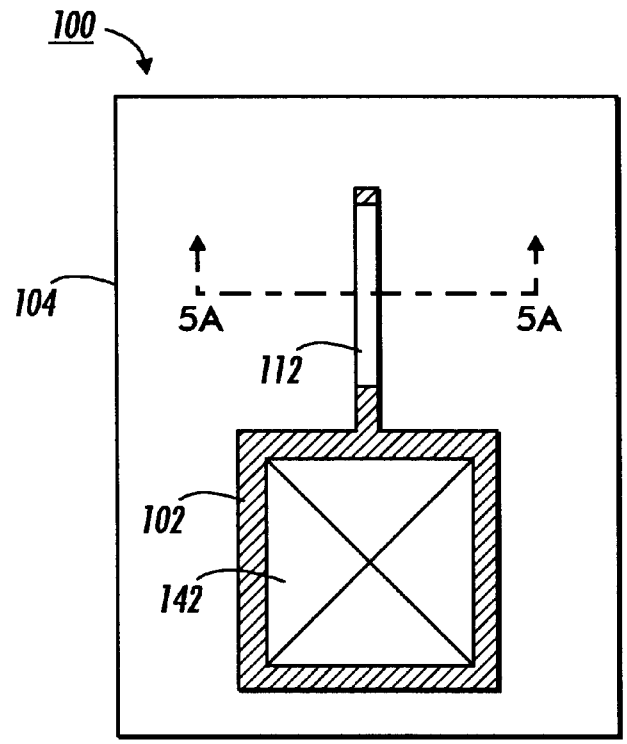

With reference now to FIGS. 5(a) and 5(b), a self-aligned optical filter island 112 is next formed from the optical filter layer 110. A layer of photoresist (not shown) is deposited over optical filter layer 110. This photoresist layer is patterned by backside (i.e., through substrate 104) exposure. Metal gate electrode 102 is opaque to the light used to expose the photoresist, and thus serves as an exposure mask. As will be later discussed, optical filter layer 110 is relatively transparent to the light used to expose the photoresist, and accordingly the photoresist is exposed except where it overlies metal gate electrode 102. Using a developer, the photoresist is developed from the top, and optical filter layer 110 is etched with a buffered HF etchant to form island 112.

The next step in the process is referred to as laser doping, and is described in detail in applicant's aforementioned copending U.S. patent application Ser. No. 08/655,549.

Laser doping is a process for doping semiconductor materials using laser ablation to generate relatively energetic dopant atoms. A laser pulse is directed onto a semitransparent source layer containing the species to be doped (this layer may be patterned, and may be n-type such as PSi or p-type such as BSi). The source layer is brought into close proximity to the substrate. During application of the laser beam, dopant atoms in the source layer are energized. Also, the laser beam briefly locally melts the surface layer of the substrate in the region to be doped. During this brief melt period, energized dopant atoms are introduced into the molten surface layer of the substrate. When the molten layer solidifies, the dopant atoms are distributed and electrically activated in the layer. Since the high temperature cycle during the doping process is as short as a few tens of nanoseconds, this technique is compatible with low temperature fabrication, which is particularly important in a-Si:H TFT fabrication.

Figure 6:
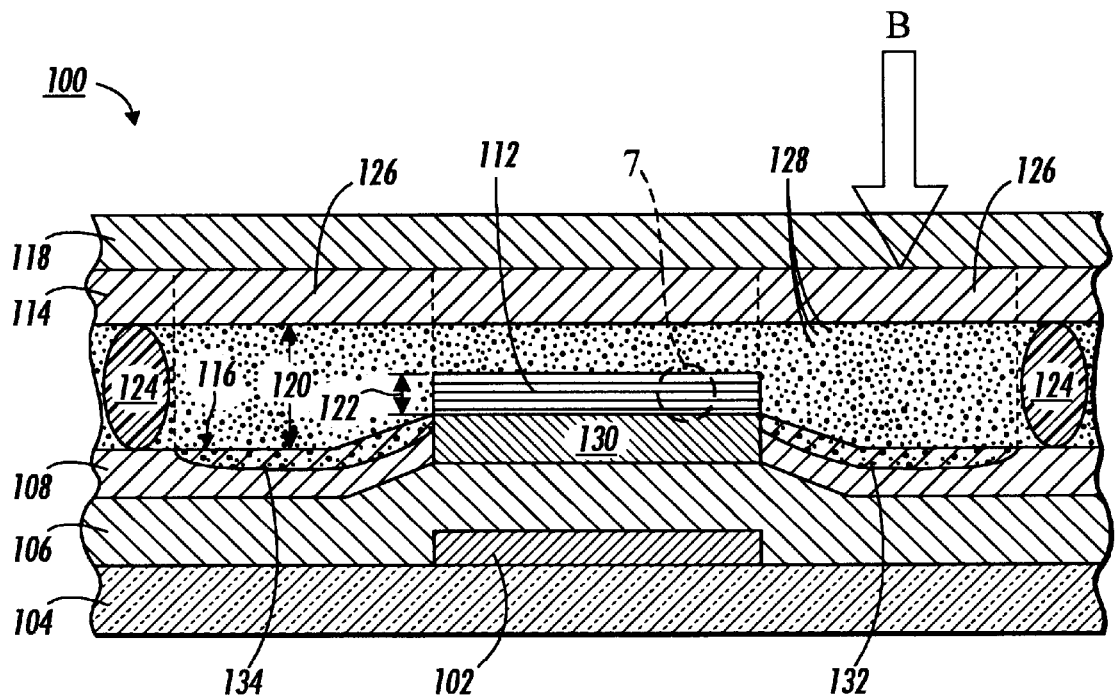
FIG. 6 is a cross-section view of a TFT according to the present invention undergoing the laser doping process during its manufacture.

With reference now to FIG. 6, laser doping proceeds first by bringing a source film 114 into proximity of the upper surface 116 of a-Si:H layer 108. The source film 114 is typically a phosphorous and silicon alloy in order to dope selected regions of a-Si:H layer 108 to be n-type. Source film 114 is uniformly distributed over one side of carrier 118 which is transparent to the laser beam, such as glass or quartz. Carrier 118 with source film 114 is placed in close proximity to upper surface 116, with source film 114 facing upper surface 116. Gap 120 between source film 114 and upper surface 116 will be equal to at least the thickness 122 of island 112, for example approximately 0.5 mm, but may be up to several millimeters. Spacers 124 and/or island 112 determine the size of gap 120. Generally, the smaller the gap between the source film 114 and the upper surface 116, the greater the number of dopant atoms that will be incorporated into a-Si:H layer 108.

After the source film 114 has been appropriately positioned, a laser beam B is directed from above through the carrier 1 18 onto an area 126 of source film 114. Alternatively, the laser may be caused to scan across the entire layer 114. During this process, the laser ablates the source film 114, releasing energetic dopant atoms 128 into gap 120. These atom may have kinetic energies of 100 eV or greater. A suitable laser for this process is an XeCl excimer laser with a wavelength of about 308 nm. An example of source film 114 is PSi, which may be deposited onto carrier 118 by plasma enhanced chemical vapor deposition at about 250° C. to a thickness of about 100 Å.

In addition to ablating source film 114, the laser energy also melts those portions of upper surface 116 onto which it is incident. Importantly, island 112 is opaque (for example by reflectance via interference) to the laser beam B. Thus, the region under island 112, namely channel 130, is not damaged by the laser beam. However, below region 126, dopant atoms do enter layer 108, forming for example an n+ doped source region 132 and an n+ doped drain region 134. The inability of the prior art to reach the material closest to the channel due to shadowing from the edge of the gate electrode is thereby addressed.

This also highlights an important aspect of the present invention. The material forming optical filter layer 110 must be relatively transparent to the radiation used to expose the photoresist deposited over layer 110 (e.g., approximately 400 nm), to thereby form island 112, while at the same time it must also be relatively opaque to the laser light used to ablate the source film 114 and locally melt upper surface 116 (e.g., approximately 308 nm).

Figure 7:
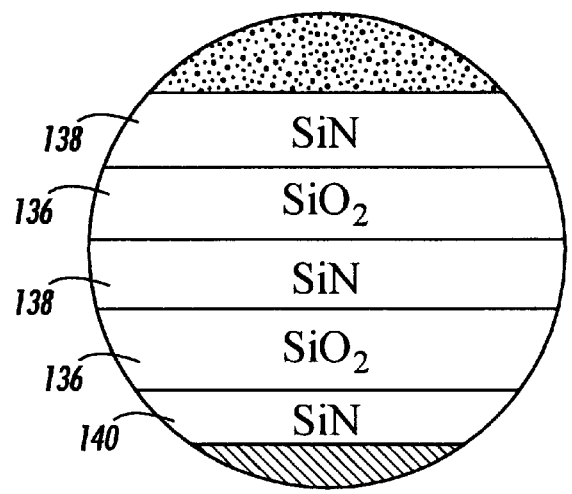
FIG. 7 is a cross-section of a portion of an optical filter island according to the present invention.

Referring now to FIG. 7, a section of island 112 is shown in cross-section. Island 112 (and hence optical filter layer 110) may be composed of a number of sublayers arranged in a stack. One example of such a stack is alternating layers 136 and 138 of silicon dioxide and silicon nitride, respectively. Silicon nitride is chosen to be the uppermost layer, as shown, since it will resist the introduction of dopants during the laser doping process, and thereby provide improved protection for the underlying material. The lowermost layer 140 is also chosen to be silicon nitride for improved resistance to doping and optimized passivation over the a-Si:H channel. Other material systems which may be suitable for the present application include $Si/SiO_2$, $Si/Al_2O_3$, $SiO_2/TiO_2$, etc., with the key feature being that, as between the two layers of each pair, each layer has a different refractive index. One example of the resulting structure is a so-called distributed Bragg reflector (DBR). Another example would be a so-called graded index DBR, where the material's index changes as a function of position in the thickness direction of the material.

Both the type of material and the thickness of each sublayer play an important role in providing the selective transmission and reflection required of optical filter layer 110. Ideally, the optical thickness T of each oxide and nitride layer should be on the order of multiples of ¼ of the laser beam B's wavelength of the form $T=(¼)(\lambda/\eta)+(m/2)(\lambda/\eta)$, where $\eta$ is the index of refraction of the material and m is a positive integer 1,2, . . . , to achieve optimal reflectivity by phase matching to the beam. As an example, the thickness of the oxide layer 136 may be (¼)(308 nm)(1/1.48)=52 nm and the thickness of the nitride layer 138 may be (¼)(308 nm)(1/2.1)=36.7 nm, where 1.48 and 1.21 are the indices of refraction of silicon dioxide and silicon nitride, respectively. The thickness of the lowermost nitride layer 140 may be different than the thicknesses of the other individual layers, for example on the order of 60–65 nm, in order to phase match to the pairs above. That is, since the material below lowermost layer 140 is a-Si:H, as opposed to $SiO_2$ or SiN, layer 140 will have a different thickness to achieve phase matching than the layers above it.

Figure 8:
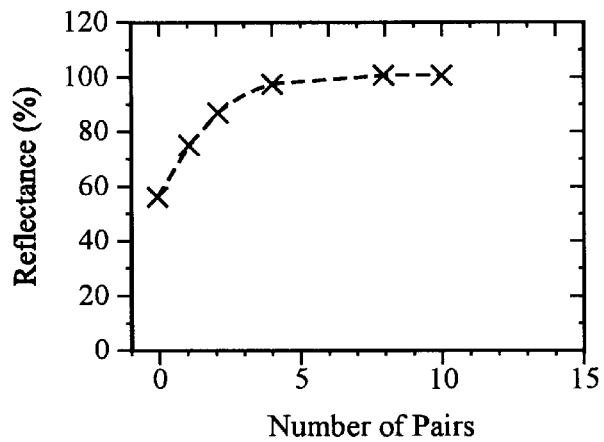
FIG. 8 is a plot of the reflectance of an optical filter island as a function of the number of layer pairs comprising that island.

Another important facet of enabling the selective reflectance and transmission of optical filter layer 110 is the number of its sublayers. The proper level of reflection will protect the a-Si:H channel underlying island 112. FIG. 8 shows a simulation of the reflectance of a laser beam at 308 nm as a function of the number of oxide/nitride layer pairs comprising optical filter island 112. According to the present embodiment, the required reflectance has been determined to be at least 80%. As shown in FIG. 8, this requirement may be satisfied by a two-pair optical filter layer. A single pair may also function depending, for example on the power of the laser, etc.

Figure 9A:
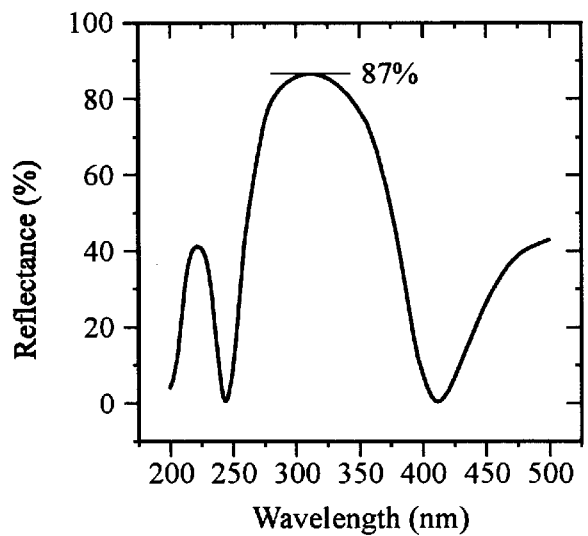
FIG. 9(a) and FIG. 9(b) are plots of reflectance over a range of wavelengths for a modeled and an actual optical filter island, respectively.
Figure 9B:
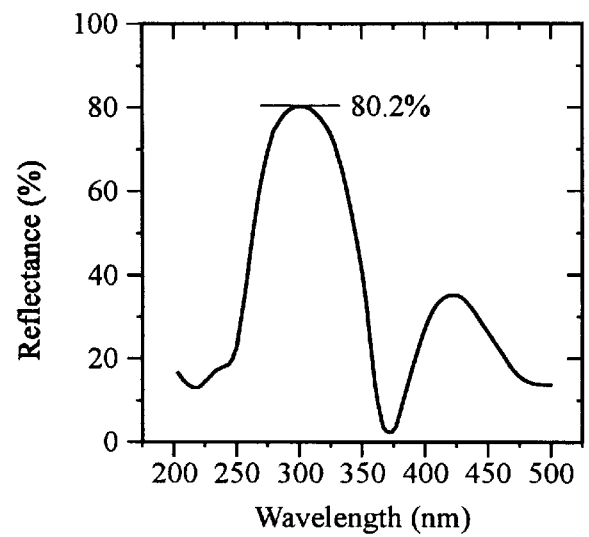

FIGS. 9(a) and 9(b) show simulated and measured optical reflection spectra for a two-pair optical filter layer 110, respectively. As will be seen, the simulation agrees well with the actual data. The differences between simulated and measured optical reflection are mostly due to (1) an assumption of negligent dispersion (no change in index for a change in $\lambda$) for simulation, and (2) assuming uniform optical thickness for the individual layers. The two-pair optical filter layer 110 provides 80% reflection at 308 nm, which is sufficient to protect the a-Si:H channel. The transmission at the UV wavelength of 400 nm is about 80%, which allows for the backside self-aligned lithography process. The total thickness of the two-pair optical filter layer is about 241 nm. This thickness is suitable for the standard buffered HF wet etch process.

Finally, since the proposed island 112 can be formed of standard dielectric materials, it also can be used as a gate dielectric layer. Therefore, island 112 is useful for top-gate TFT structures as well as bottom-gate TFT structures.

Returning to the fabrication process for structure 100, 5–10 minutes of plasma hydrogenation at 250° C. is performed to passivate the defects induced by the laser doping in source region 132 and drain region 134.

With reference now to FIGS. 10(a) and 10(b), a via 142 (shown in FIG. 10(b)) to contact the gate electrode 102 is then patterned and etched. A metal contact layer (not shown), for example TiW/Al, is then deposited over the structure. This metal layer is then patterned and etched by standard lithography and wet etch, or processes otherwise known in the art, to form source electrode 144 and drain electrode 146. The distance between the edge of the metal electrodes 144, 146 and the edge of the island 112, labeled Δx, can be as large as 5 μm or larger.

Figure 11A:
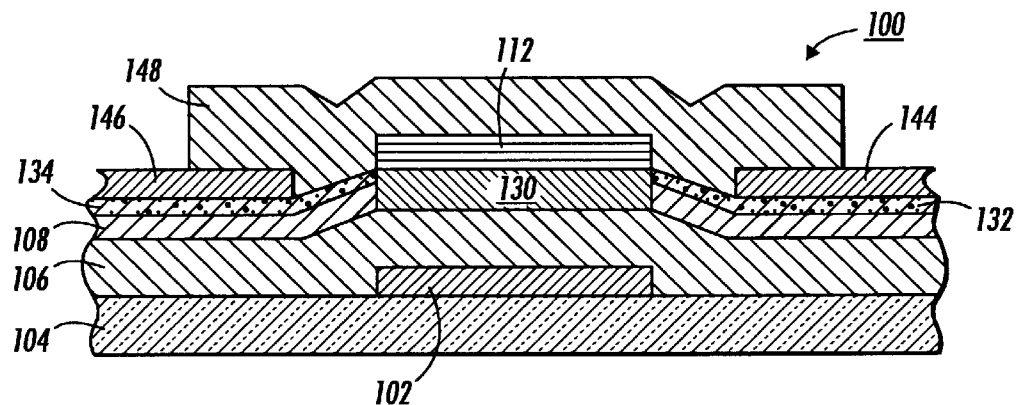
FIG. 11(a), FIG. 11(b), and FIG. 11(c) are cross-section, plan, and cut-away views, respectively, of a completed TFT according to the present invention.
Figure 11B:
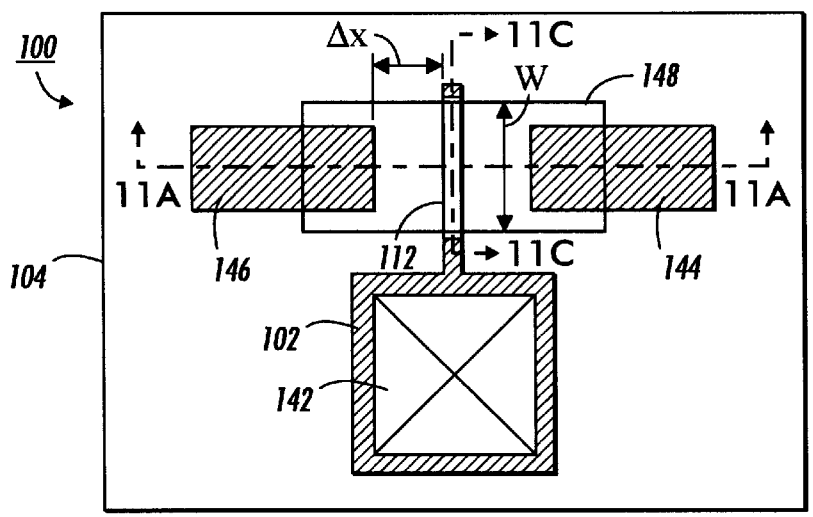

Referring now to FIGS. 11(a) and 11(b), a passivation layer of silicon nitride or silicon dioxide 148 is deposited by PECVD and patterned to define the width of structure 100. Finally, structure 100 is established by a silicon etch which removes all a-Si:H outside of the area covered by the source electrode 144, drain electrode 146, gate via 114, and patterned passivation layer 148.

Figure 1A:
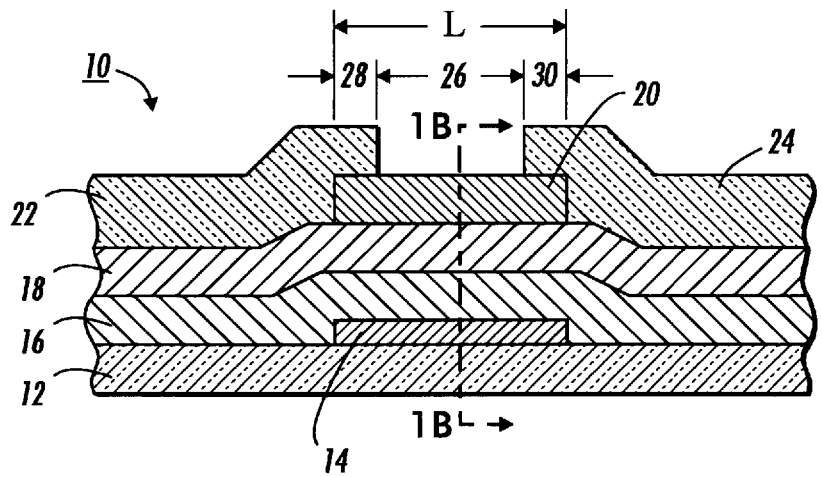
FIG. 1(a), FIG. 1(b), and FIG. 1(c) are a cross-sectional view, cut-away view, and a top view of a thin film transistor according to the prior art, respectively.
Figure 1B:
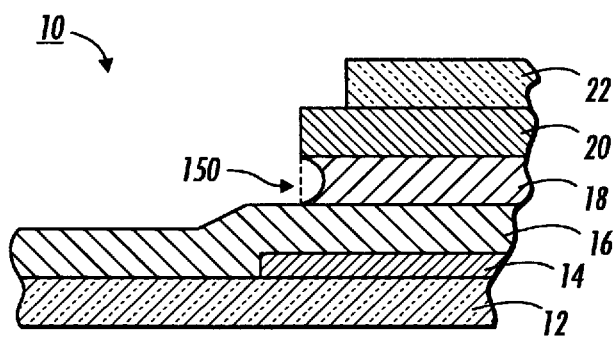
Figure 1C:
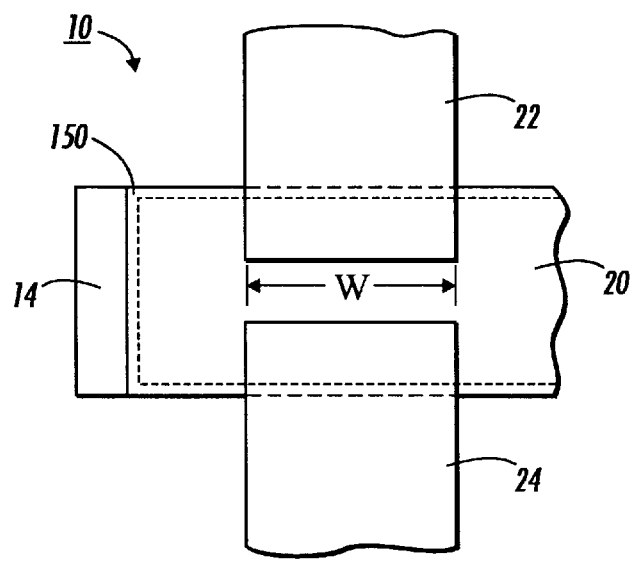

A common problem in thin film transistors is sidewall leakage current between the source and drain caused by impurities left on the side walls of layer 18. In a conventional TFT structure (FIGS. 1(a), (b), (c)), the channel width, w, is defined by the width of source and drain electrodes 22, 24. Since each of these electrodes overlap the channel, the side wall of the active layer may be overetched at 150 (FIG. 1(b)) to reduce leakage current. Electrical contact between the source region and the channel, and the drain region and the channel is not affected since the a-Si:H layer is protected where overlapped by the source and drain electrodes.

Figure 11C:
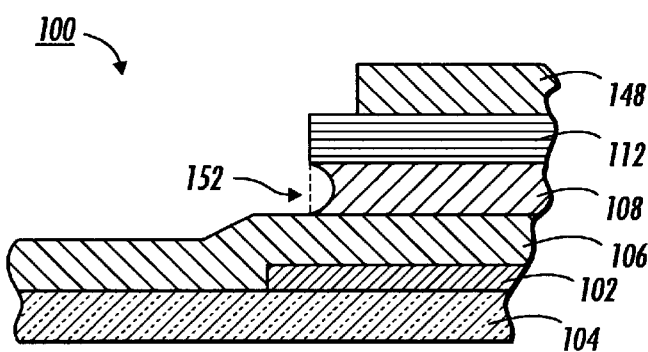

For the TFT according to the present invention, however, this over etch would break electrical contact between the source region and channel, and drain region and channel, since there is no protection on the edge of the contact (i.e., no overlapping electrodes). As shown in FIG. 11(b), passivation layer 148 is formed to overlay both the source electrode 144 and drain electrode 146, and thereby overlay the gaps between these electrodes and the optical filter layer 112. Any overetching may then proceed without breaking the electrical contact between source region 132 and channel 130, and drain region 134 and channel 130. In addition, passivation layer 148 is left slightly narrower (e.g., 2–5 μm narrower), in the direction of the width w, than optical filter island 112 to avoid lithography mask misalignment. If the lithography mask is misaligned over optical filter island 112, then layer 108 may not be over etched at region 152, shown in FIG. 11(c), since it may be covered in that region by the passivation layer 148. Thus, an over etched region 152 may be provided in layer 108 to remove impurities that may give rise to sidewall leakage current.

Figure 2:
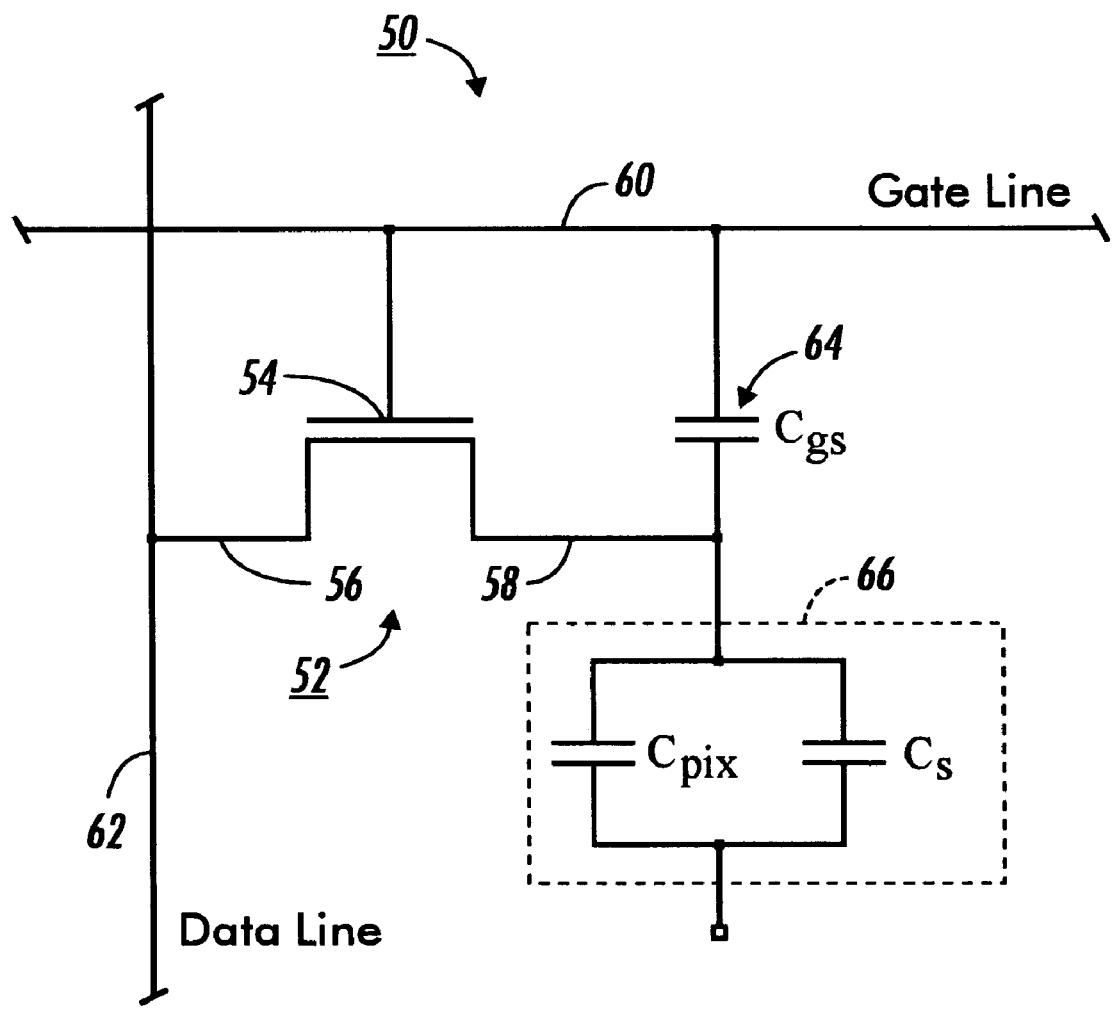
FIG. 2 is a schematic diagram of one cell of an array of such cells which includes a thin film transistor and pixel according to the prior art.
Figure 3:
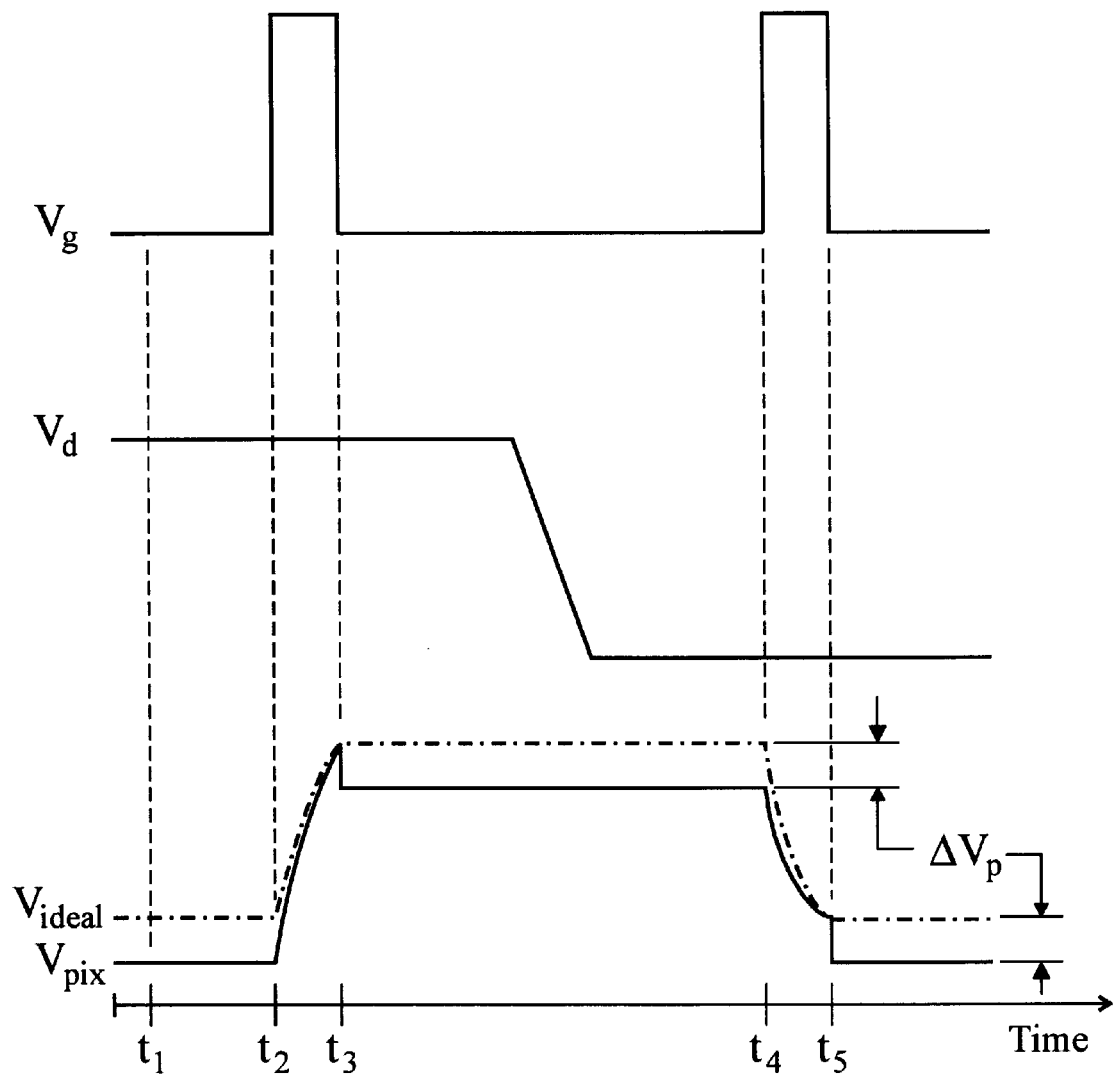
FIG. 3 is an illustration of various voltages within the cell shown in FIG. 2 as a function of time.

As will now be appreciated with reference to FIG. 11(a), neither the source electrode 144 nor drain electrode 146 of TFT 100 overlap the gate electrode 102 of this structure. The edges of the source and drain regions are contiguous with the edges of the channel, and hence "self-aligned" with the channel. The parasitic capacitance $C_{gs}$ due to overlap of the source (and drain) contact over the gate contact is eliminated, and the problems of feed-through voltage fully addressed. Voltage characteristics on a pixel (such as pixel 66 in the arrangement of FIG. 2) may therefore more closely approximate the ideal characteristics shown by the dashed $V_{ideal}$ of FIG. 3. An analysis of structures produce in accordance with the above teachings supports this analysis.

We have conducted a number of studies of laser doping. In one such study, 100 nm of a-Si:H was deposited on a quartz substrate by low pressure chemical vapor deposition (LPCVD). A phosphorous dopant was laser ablated from the substrate using a XeCl excimer laser.

The doping efficiency and depth depend on the laser doping energy density. The phosphorous diffusion coefficient in molten Si is about $10^{-4}$ cm$^2$/s, which is very fast compared with the solid phase diffusion rate of about $10^{-11}$ cm$^2$/s. Since the temperature rise and fall in Si films during and after a pulsed laser irradiation is abrupt, effective dopant diffusion occurs primarily in the liquid phase. A higher laser doping energy results in a longer melt duration and deeper melting depth which leads to a higher doping level and deeper doping depth. FIG. 12 shows the results of an experiment measuring doping efficiency against the laser doping energy density. The doping efficiency increases rapidly with the energy when the energy exceeds the Si surface melting threshold of about 150 mJ/cm$^2$. At 350 mJ/cm$^2$ laser doping energy density, the equivalent doping rate is about $1.6 \times 10^{14}$ atom/cm$^2$ per laser pulse. About $10^{14}$ atoms/cm$^2$ is a typical dose required to form the TFT source and drain regions.

FIG. 13 plots the doping depth as a function of the laser doping energy density. The doping depth behaves similarly to the melting depth as a function of the laser energy density. In general, the solid/liquid interface moves toward the surface while the dopants diffuse in the opposite direction during the solidification. As a results, the doping depth is slightly shallower than the melting depth.

We have fabricated numerous self-aligned TFTs of the type previously described. Channel lengths of these structures ranged from 3 to 10 μm. The overall width of these structures was on the order of 15 μm. Laser doping was performed at 230–250 mJ/cm$^2$, with between 10 and 100 pulses of an XeCl laser. The gap Δx varied between 1 and 5 μm for these structures.

For the longer channel devices, we have observed DC performance comparable to conventional TFTs. FIG. 14 shows the transfer characteristics for a self-aligned TFT, as taught by the present invention, having a channel length of approximately 10 μm. The laser doping was performed at 250 mJ/cm$^2$ with 10 pulses. At the source/drain voltage of 10 volts, the field effect mobility, the threshold voltage, the sub-threshold slope, and the off-state current are similar to that of conventional a-Si:H TFTs.

Figure 16:
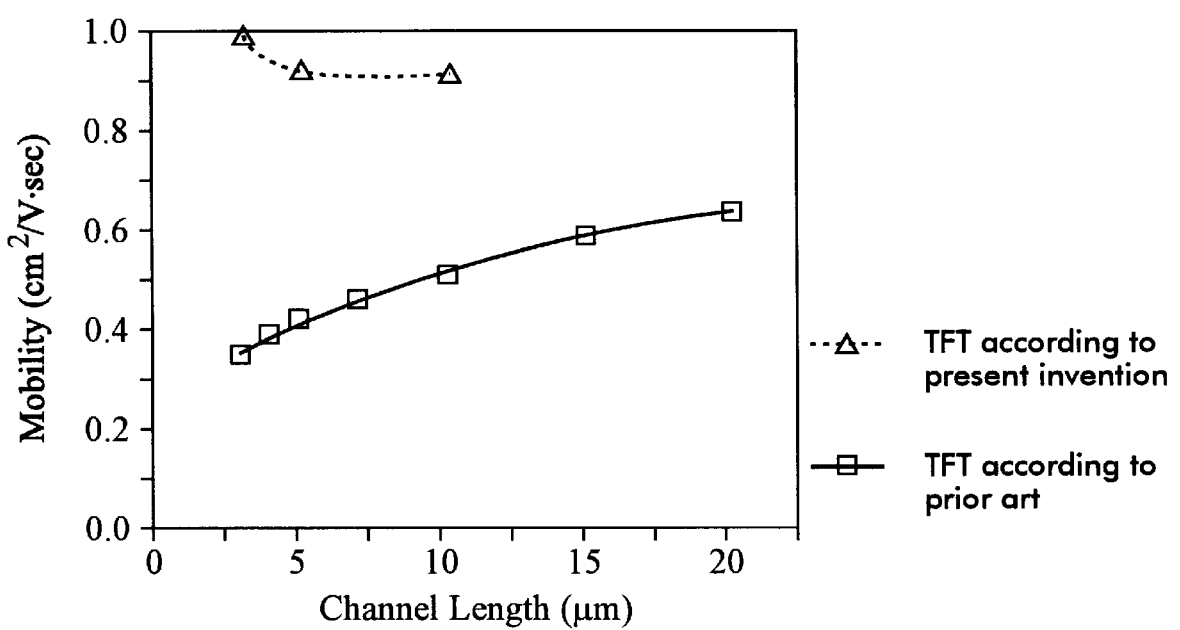
FIG. 16. is a comparison of the mobility versus the channel length of a TFT as fabricated according to the state of the art and as fabricated according to the present invention.

FIG. 15 shows the transfer characteristics of a self-aligned TFT, according to the present invention, which has a channel length of 3 μm. In general, when the channel length is scaled down, the leakage current and the sub-threshold slope are increased, and the threshold voltage is reduced, as shown. The mobility, however, is not decreased by the scaling down, which is contrary to the general belief that the apparent mobility for short channel TFTs is smaller in comparison to that of long channel TFTs. A comparison of the mobility versus the channel length of a TFT as fabricated according to the state of the art and as fabricated according to the present invention is shown in FIG. 16. State of the art TFT data follows the generally known mobility curve which shows relatively low mobility for short channel devices, due to large contact resistance as compared to channel resistance. The TFT according to the present invention shows much higher mobility at short channel lengths, indicating that contact resistance is negligible.

Figure 17A:
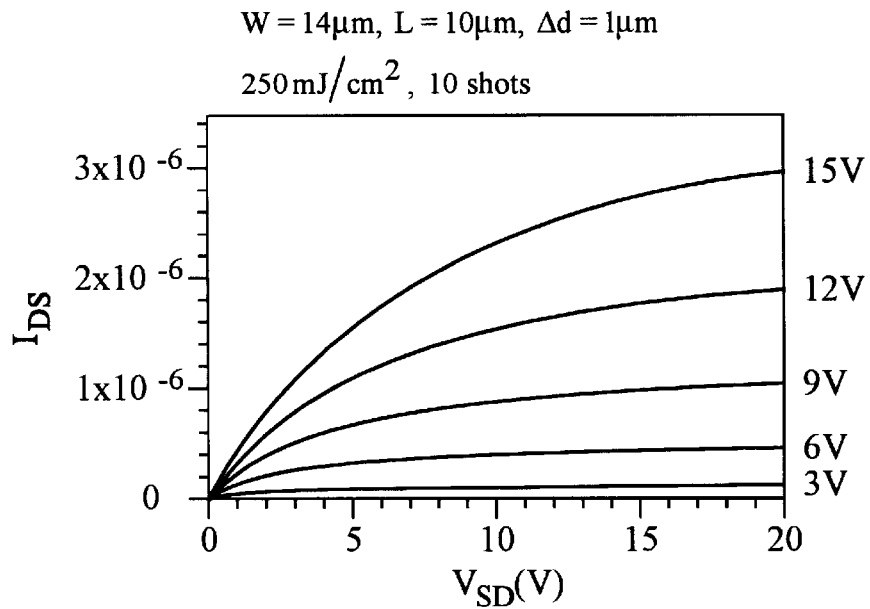
FIG. 17(a) and 17(b) shows the output characteristic of TFTs with channel lengths of 10 $\mu$m and 3 $\mu$m, respectively.
Figure 17B:
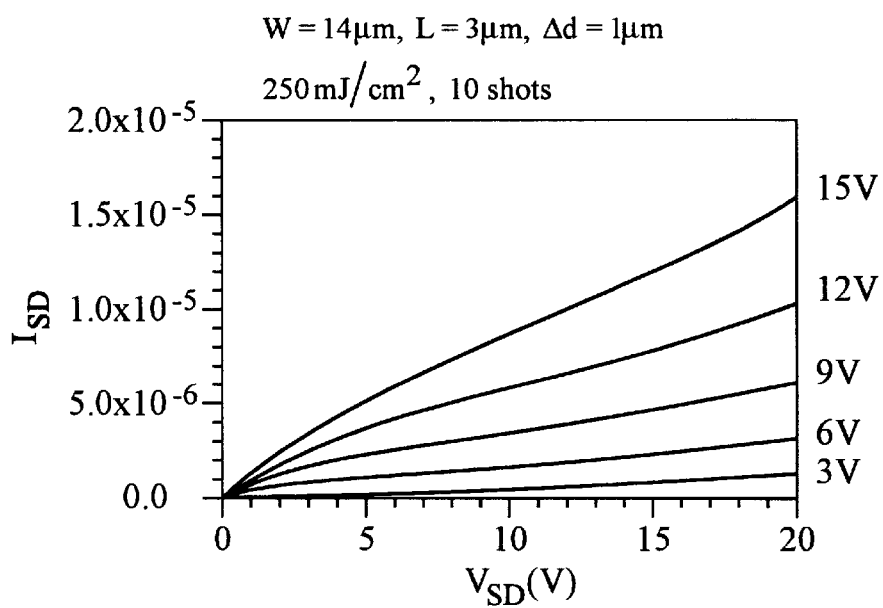

FIGS. 17(a) and 17(b) show the output characteristic of TFTs with channel lengths of 10 and 3 μm, respectively. No current crowding is evident in either device, indicating qualified device contact. A further investigation of the contact has been made by comparing the on-state behavior among the similar TFTs with different Δx. As shown in FIG. 18, in the range of 1–5 μm, the size of Δx does not affect the TFT behavior, indicating a sufficient sheet resistance in the doped regions for the source and drain electrodes. Therefore, an accurate alignment for the source and drain electrode is not critically required as part of the current TFT fabrication process.

For most display applications, the pixel TFTs are operated in the linear region. The TFT contact resistance in the linear region was determined from the inverse of the output conductance. The contact resistance is the intersection of the device output resistance with zero channel length. FIG. 19 shows a comparison of the contact resistance of the electrodes as taught by the present invention and as conventionally known. The TFTs of the present invention and the conventional TFTs have similar channel properties and gate dielectrics. As a result, the slopes of the straight line fits to the data of FIG. 19 are almost equal. The contact resistance, normalized to 1 μm channel width, for the conventional electrode and the laser processed electrode are 16.2 and 0.76 MΩ·μm respectively. The low contact resistance of the laser doped source and drains results in a high performance short-channel a-Si:H TFT.

Short-channel TFTs facilitate an improvement in the fill factor for large-area displays. Since the TFT ON-current is proportional to the ratio of the channel width to channel length, the improvement in the fill factor is related to the second power of the reduction of the channel length for constant W/L (channel width to length ratio). With the self-aligned structure shown in FIGS. 11(a) and 11(b), the TFT channel length can be readily scaled down.

Figure 20:
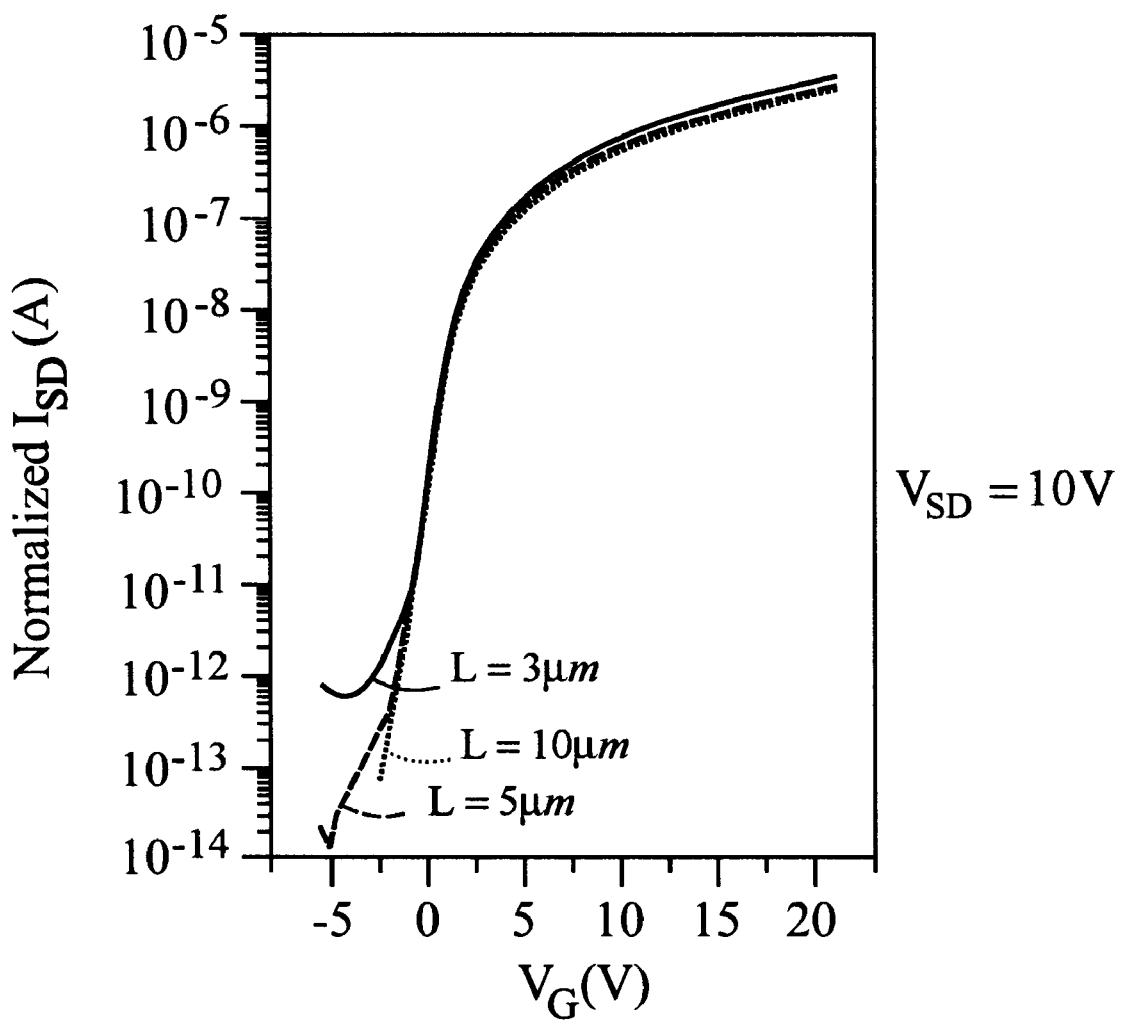
FIG. 20 shows the results of an experiment measuring the device transfer characteristic for laser processed a-Si:H TFTs with channel lengths of 3, 5, and 10 $\mu$m.

Several factors are of interest for display applications when the TFT dimension is scaled down. One is the field effect mobility for short-channel TFTs. As discussed earlier, the contact resistance has to be much smaller than the channel resistance in order to maintain the same TFT mobility when scaling down the channel length. FIG. 20 shows the results of an experiment measuring the device transfer characteristic for laser processed a-Si:H TFTs with channel lengths of 3, 5, and 10 μm. It can be seen that the saturation current for the 3 μm device is about the same as that of the 10 μm device.

Another concern in the scaling of TFTs is related to the short-channel effects. These effects include reduction of the threshold voltage, increase in off current, and decrease in the sharpness of the sub-threshold slope. In FIG. 20, it is seen that minor reductions in the sub-threshold slope and the threshold voltage occur. The OFF current for the 3 μm device is about 0.5 pA/μm, which is sufficiently low for certain display applications.

Figure 21:
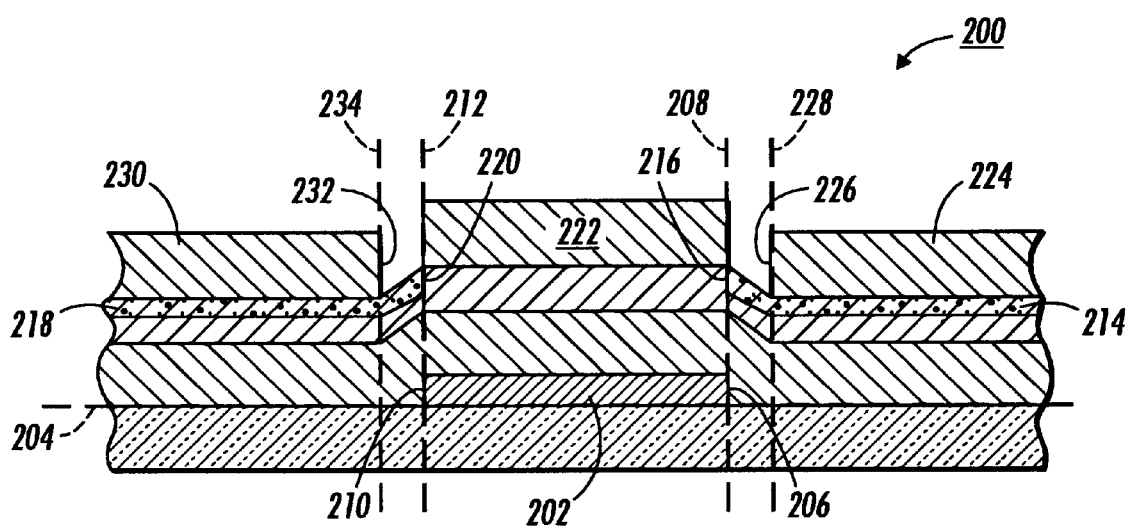
FIG. 21 is a cross-section view of a TFT according to the present invention.

In summary, with reference to FIG. 21, the present invention provides a semiconductor structure 200, comprising a gate region 202, formed in a first plane 204, having first gate edge 206 lying in a first gate edge plane 208 and a second gate edge 210 lying in a second edge plane 212, said first gate edge plane 208 and said second edge plane 212 being generally perpendicular to the first plane 204, a source region 214 having a first source edge 216 lying in said first gate edge plane 208 such that said first source edge 216 is adjacent to but not overlapping the gate region 202, a drain region 218 having a first drain edge 220 lying in said second gate edge plane 212 such that said first drain edge 220 is adjacent to but not overlapping the gate region 202, and an optical filter island 222 located between the source region 214 and the drain region 218.

In addition, structure 200 may be provided with a source electrode 224 having a first source electrode edge 226 lying in a plane 228 roughly parallel to the first gate edge plane 208, the first source electrode edge 226 being spaced apart from the first gate edge plane 208 by, for example, 5 μm, and further provided with a drain electrode 230 having a first drain electrode edge 232 lying in a plane 234 roughly parallel to said second gate edge plane 212, said first drain electrode edge 232 being spaced apart from said second gate edge plane 212 by, for example, 5 μm. In this structure, neither the source nor drain electrodes 224, 230 overlap the gate region 202.

We have described material properties and device performance related to a TFT manufactured by a laser doping technique according to the present invention. The laser doping process provides a practical method to form source and drain regions for a-Si:H TFTs with a high doping efficiency. The contact resistance of the laser doped source/drain is about 20 times smaller than that of the conventional doped a-Si:H electrode. The low contact resistance maintains the TFT field effect mobility when the channel length is scaled down (minor short channel effects were observed for the 3 μm devices). The OFF-current of the 3 μm TFT is sufficiently low to meet the requirements for a pixel switch.

While the invention has been described in terms of a number of specific embodiments, it will be evident to those skilled in the art that many alternatives, modifications, and variations are within the scope of the teachings contained herein. For example, the active layer of the TFT described above is undoped, intrinsic a-Si:H. However, the active layer may be doped to provide desired TFT characteristics. Accordingly, the present invention should not be limited by the embodiments used to exemplify it, but rather should be considered to be within the spirit and scope of the following claims, and equivalents thereto, including all such alternatives, modifications, and variations.

What is claimed is:

1. A semiconductor structure comprising:
   a gate region, formed in a first plane, having first gate edge lying in a first edge plane and a second gate edge lying in a second edge plane, each said first and second edge planes being generally perpendicular to said first plane;
   a source region having a first source edge lying approximately in said first edge plane;
   a drain region having a first drain edge lying approximately in said second edge plane;
   an optical filter island located between said source and drain regions, said optical filter island comprising at least three layers including a first layer having a first index of refraction, a second layer having a second index of refraction, and a third layer adjacent to said second layer, the third layer having approximately the first index of refraction, the second index of refraction different from the first index of refraction, the layers arranged such that the optical filter island is reflective of a first radiation wavelength and transmissive of a second radiation wavelength.

2. The semiconductor structure of claim 1, further comprising an insulating layer in physical contact with said gate region, and an active layer in physical contact with said insulating layer, and further wherein said source and drain regions are formed in said active layer.

3. The semiconductor structure of claim 2, further comprising a source electrode in electrical communication with said source region and a drain electrode in electrical communication with said drain region.

4. The semiconductor structure of claim 3, wherein said source electrode has a source electrode edge lying in a plane roughly parallel to said first edge plane, said source electrode edge being spaced apart from said first edge plane by no more than 5 µm, and further wherein said drain electrode has a drain electrode edge lying in a plane roughly parallel to said second edge plane, said drain electrode edge being spaced apart from said second edge plane by no more than 5 µm, and further such that neither said source nor drain electrodes overlap said gate region.

5. The semiconductor structure of claim 2, wherein said structure is provided with a transistor channel in said active layer.

6. The semiconductor structure of claim 2, wherein said active layer has sidewalls, said sidewalls being selectively etched to remove contaminants therefrom to thereby reduce sidewall leakage current between the source region and the drain region.

7. The semiconductor structure of claim 1, wherein said source region and said drain region are formed by laser doping employing a laser having a wavelength λ, and further wherein said optical filter island is comprised of at least a first layer of material having an index of refraction η and an optical thickness T equal to $$T = \frac{1}{4}\frac{\lambda}{\eta} + \frac{m}{2}\frac{\lambda}{\eta}$$

where m is a positive integer.

8. The semiconductor structure of claim 7, wherein said optical filter island further includes a second layer of material having a different index of refraction than said first layer of material.

9. The semiconductor structure of claim 1, wherein said first layer includes silicon nitride and said second layer includes silicon dioxide.

10. The semiconductor structure of claim 1 wherein the optical filter island further comprises:
 a fourth layer adjacent to said third layer, the fourth layer having the second index of refraction.

11. The semiconductor structure of claim 1 further comprising:
 a photoresist layer deposited adjacent the optical filter island, the photoresist layer positioned to allow exposure light to pass through a substrate and the optical filter island and expose the photoresist layer.

12. The semiconductor structure of claim 1 wherein at least one layer of the at least three layers includes silicon nitride.

13. The semiconductor structure of claim 1 wherein said drain and said source are formed by ion implantation and subsequent ablation.

14. The semiconductor structure of claim 1 wherein the first radiation wavelength is a wavelength that passes through the optical filter island and exposes a photoresist layer adjacent to a first side of the optical filter island and the second radiation wavelength is a wavelength used to ablate regions of a source film unprotected by a second side of the optical filter island.

15. The semiconductor structure of claim 1 wherein at least one layer of the optical filter island has an index of refraction η, the at least one layer having a thickness which is an integral multiple of one quarter of the second radiation wavelength divided by the index of refraction η.

16. A semiconductor structure comprising:
 a gate region, formed in a first plane, having first gate edge lying in a first edge plane and a second gate edge lying in a second edge plane, each said first and second edge planes being generally perpendicular to said first plane;
 a source region having a first source edge lying approximately in said second edge plane; and
 an optical filter island located between said source and drain regions wherein said optical filter island is at least 80% transmissive of radiation at 400 nm, and at least 80% reflective of radiation at 308 nm.

17. The semiconductor structure of claim 16 wherein the optical filter island includes at least two layers.

18. The semiconductor structure of claim 17 wherein at least one layer of the plurality of layer includes silicon nitride.

19. The semiconductor structure of claim 16 further comprising:
 a photoresist layer formed over the optical filter island.

* * * * *